United States Patent [19]
Kohlert et al.

[11] Patent Number: 5,635,780
[45] Date of Patent: Jun. 3, 1997

[54] INSTRUMENT HOLDER AND METHOD FOR INSPECTION OF A DYNAMO-ELECTRIC MACHINE IN A GAP BETWEEN A STATOR AND A ROTOR AND DYNAMO-ELECTRIC MACHINE HAVING THE INSTRUMENT HOLDER

[75] Inventors: Erich Kohlert, Erlangen; Otto Wirxel, Essen, both of Germany

[73] Assignee: Siemens Aktiengesellschaft, Munich, Germany

[21] Appl. No.: 541,087

[22] Filed: Oct. 11, 1995

Related U.S. Application Data

[62] Division of Ser. No. 188,534, filed as PCT/EP92/01315, Jun. 11, 1992, Pat. No. 5,481,929.

[30] Foreign Application Priority Data

| Jun. 21, 1991 | [EP] | European Pat. Off. | 91110269 |
| Jul. 4, 1991 | [EP] | European Pat. Off. | 91111160 |
| Sep. 3, 1991 | [DE] | Germany | 91 10 922.1 |

[51] Int. Cl.$^6$ .................................................. H02K 11/00
[52] U.S. Cl. ................ 310/68 R; 73/865.8; 73/866.5; 310/66; 310/67 R
[58] Field of Search ....................... 310/68 K; 73/865.8

[56] References Cited

U.S. PATENT DOCUMENTS

| 2,596,322 | 5/1952 | Zumwalt . | |
| 3,610,652 | 10/1971 | Russel et al. . | |
| 4,055,990 | 11/1977 | Topping . | |
| 4,255,762 | 3/1981 | Takeyasu et al. . | |
| 4,378,699 | 4/1983 | Wickramasinghe . | |
| 4,889,000 | 12/1989 | Jaafar et al. . | |
| 4,970,890 | 11/1990 | Jaafar et al. | 73/12 |
| 5,020,234 | 6/1991 | Alkire et al. . | |
| 5,105,658 | 4/1992 | Jaafar et al. | 73/865.8 |
| 5,481,929 | 1/1996 | Kohlert et al. | 73/865.8 |

FOREIGN PATENT DOCUMENTS 0157304  6/1990  European Pat. Off. .

*Primary Examiner*—Thomas M. Dougherty
*Assistant Examiner*—Elvin G. Enad
*Attorney, Agent, or Firm*—Herbert L. Ierner; Laurence A. Greenberg

[57] ABSTRACT

A dynamo-electric machine includes a stator having a ferromagnetic yoke with an internal recess and a rotor disposed in the internal recess defining a gap between the yoke and the rotor. An instrument holder to be introduced into the gap for inspecting the dynamo-electric machine includes a frame section and instruments secured to the frame section for inspecting the dynamo-electric machine. At least one wheel set has at least three wheels for moving the instrument holder in the gap. Each of the wheels is rotatable about a respective one of approximately mutually parallel axes. A connection device is to be connected to leads for connecting the instrument holder to a control and evaluation device. At least one magnet presses the wheels of the instrument holder against the yoke in the gap. A method for inspecting the dynamo-electric machine includes introducing an instrument holder, carrying means for inspecting the machine, into the gap; and pressing the instrument holder against the yoke with at least one magnet. A dynamo-electric machine has the instrument holder disposed in the gap.

9 Claims, 3 Drawing Sheets

1

INSTRUMENT HOLDER AND METHOD FOR INSPECTION OF A DYNAMO-ELECTRIC MACHINE IN A GAP BETWEEN A STATOR AND A ROTOR AND DYNAMO-ELECTRIC MACHINE HAVING THE INSTRUMENT HOLDER

CROSS-REFERENCE TO RELATED APPLICATION

This application is a division of application Ser. No. 08/188,534, filed Dec. 21, 1993, now U.S. Pat. No. 5,418,429; which was a Continuation of International Application Serial No. PCT/EP92/01315, filed Jun. 11, 1992.

BACKGROUND OF THE INVENTION

Field of the Invention

The invention relates to instrument holders and methods for inspection of a dynamo-electric machine and dynamo-electric machines having the instrument holder, including a stator with a ferromagnetic yoke, a rotor being disposed in an internal recess of the yoke leaving a gap between the stator and the rotor, and instruments being introduced into the gap between the stator and the rotor for carrying out the inspection.

Assuring malfunction-free operation of an industrial dynamo-electric machine, particularly a turbo generator, and ascertaining any incipient malfunction of such a machine early, requires regular inspection of machine components that are repeated at intervals of from several months to several years, in which many kinds of examinations and tests must always be performed. One possible test is the visual inspection of the correspondingly accessible surfaces of the components of the machine, particularly the surfaces of the stator and the rotor. Other possible tests include inspecting the components by means of ultrasound using various methods, and checking the magnetizability of the yoke (which includes laminated metal plates in a stator) that is present in any dynamo-electric machine. In the case of such a test, the effect of a weak and locally limited magnetic field upon the yoke can, for instance, be determined and evaluated. Finally, mechanical tests should also be carried out, particularly strength tests and tests for any possible cracks. Last but not least, it is desirable to have the capability of rescuing smaller parts, such as loose screws or the like, from the machine.

The usual methods for inspecting a dynamo-electric machine require the removal of the rotatable part or rotor, which particularly in the case of industrial dynamo-electric machines, with electrical power outputs of several hundred MVA, is extremely time-consuming and expensive.

In order to enable such expensive dismantling work to be dispensed with if possible, an apparatus is known that permits pulling an instrument platform through the gap between the stator and the rotor of an industrial dynamo-electric machine (this gap is typically called an "air gap", regardless of the coolant system installed in the machine). The instrument platform runs on guide rails that extend from one end of the industrial machine to the other through the gap.

In an apparatus for inspecting tubes which is known from U.S. Pat. No. 4,255,762, a sensor with an optical inspection system is introduced on a support arm into the tube to be inspected. Such an apparatus is only usable in dynamo-electric machines with limitations, because in such machines the gaps to be inspected are often several meters long, with gap heights of only a few centimeters. It is virtually impossible to use support arms of such a length without vibration and without touching the stator or the rotor, so that adopting this known application to the inspection of dynamo-electric machines is not practicable.

U.S. Pat. No. 2,596,322 relates to a self-propelled carrier for welding or cutting tools for machining tubes. The carrier has wheels with built-in magnets in order to firmly hold the carrier on a tube to be machined. As intended, the carrier is supposed to circumvent the tube circumferentially and in so doing make a straight or oblique cut or carry out a welding operation.

U.S. Pat. Nos. 4,889,000, 4,970,890 and 5,105,658 relate to a system for inspecting a generator. The system includes a self-propelled device that can travel through a gap between a stator and a rotor of the generator. The device carries various means for inspecting the generator and is connected with a control and evaluation device for carrying out the inspection.

SUMMARY OF THE INVENTION

It is accordingly an object of the invention to provide an instrument holder and a method for inspecting a dynamo-electric machine in a gap between a stator and a rotor and a dynamo-electric machine having the instrument holder, which overcome the hereinafore-mentioned disadvantages of the heretofore-known devices and methods of this general type, in which instruments can be introduced into the gap securely and without vibration, even and in particular over distances on the order of magnitude of several meters, and wherein the instruments can be moved there and do not require any complicated guide devices.

With the foregoing and other objects in view there is provided, in accordance with the invention, in a dynamo-electric machine including a stator having a ferromagnetic yoke with an internal recess and a rotor disposed in the internal recess defining a gap between the yoke and the rotor, an instrument holder to be introduced into the gap for inspecting the dynamo-electric machine, comprising a frame section, instruments secured to the frame section for inspecting the dynamo-electric machine; at least one first wheel set having at least three first wheels for moving the instrument holder in the gap, approximately mutually parallel first axes, each of the first wheels being rotatable about a respective one of the first axes; a connection device to be connected to leads for connecting the instrument holder to a control and evaluation device; and at least one magnet for pressing the wheels of the instrument holder against the yoke in the gap.

The means for inspecting the dynamo-electric machine can be selected from a great number of optical, acoustical and mechanical instruments, as well as a great number of different auxiliary devices, such as lamps, grippers, and hydraulic and pneumatic equipment.

The instrument holder can be connected over suitable control leads to control devices located outside the dynamo-electric machine and is held firmly on the yoke through magnetic forces. Thus it can move through the gap primarily parallel to the axis of rotation of the rotor and requires no rigid guide devices, such as rails or the like, which would have to be pulled through the generator in some way before the instrument holder was introduced and that always involve the danger of impairment of the instruments from vibration, besides other problems.

The instrument holder is supported on the stator directly at the point where it is located at any given time and is thus always positionable reliably and in a vibration-free manner and therefore permits exact, reproducible testing of the stator and/or the rotor at any point. It will be understood that the dimensions of the instrument holder must be adapted to the dimensions of the gap through which it is to move. However, since typical air gaps in industrial dynamo-electric machines are approximately 5 cm high, this is not a significant problem. Additionally, instruments of any type that are needed for inspection are available with adequate miniaturization, so that from that standpoint as well the invention requires no restriction whatever of usual inspection methods.

The instrument holder can be equipped with a great variety of instruments. These include optical inspection devices such as video cameras, which are possibly supplemented with suitable lighting devices, ultrasonic testing equipment of many kinds, devices for investigating the dynamo-electric machine by means of magnetic fields, and mechanical testing devices for carrying out strength tests and the like. It is also conceivable to equip the instrument holder with mechanical manipulators, such as grippers, in order to recover loose parts or carry out more minor repairs and maintenance work.

In accordance with another feature of the invention, the instrument holder has at least one first motor, particularly an electric motor, with which the first wheel set can be driven. It thus is a self-propelled device that can be remote-controlled through suitable control leads and requires no force-transmitting means whatever, and in particular no cable or the like, in order to travel through the gap. Thus the instrument holder can be used in the gap, virtually completely free of external mechanical influences.

In accordance with a further feature of the invention, the magnet is a permanent magnet. Besides the electromagnets that naturally can also be used, permanent magnets are particularly usable in the instrument holder to press the instrument holder against the yoke of the dynamo-electric machine to be inspected. Both metal permanent magnets based on iron, cobalt and nickel, that are optionally formed of alloys and/or intermetallic compounds with metals from the rare earth group (such as samarium) are possible, since particularly samarium-cobalt permanent magnets generate especially high magnetic fields with a limited structural size. Magnets of composite materials made of permanent-magnetic powders in plastic matrixes are also possible. One suitable permanent magnetic powder is a powdered material essentially being formed of neodymium, iron and boron. Finally, permanent magnets made of sintered hard ferrites can also be employed.

There are many possibilities for mounting the magnet or a plurality of magnets on the instrument holder. In principle, such a magnet can be disposed at an arbitrary point of the instrument holder, although it should be as close as possible to the yoke of a dynamo-electric machine through which yoke it is to move, in order to achieve the strongest possible holding force. However, the field of the magnet should not hinder the instruments used for the actual inspection of the dynamo-electric machine. In order to prevent this latter effect, it may be advantageous under some circumstances to provide a number of magnets in such a way that one magnet is disposed in the vicinity of each respective first wheel, for instance by being secured to the frame section.

In order to provide for control and operation of the means used for inspection, the instrument holder merely requires the connection of leads, such as electrical leads, in order to connect the first motor which may be present, as well as the instruments and additional devices that may also be present, such as lighting equipment, to a control and evaluation device that can be stationed outside the dynamo-electric machine and may, for instance, be a small computer, equipped with suitable interfaces. It is also conceivable to provide an instrument holder with pneumatic or hydraulic means, such as a suitable motor or corresponding instruments (such as a gripper). Flexible pressure lines for gases and/or liquids can be used equally unproblematically as electric leads in conjunction with the instrument holder, which would then have to have a suitably adapted connection device. In no case does the instrument holder require the provision of mechanically rigid connecting elements such as rails. This makes it considerably easier to use than the previously conventional inspection equipment.

In accordance with an added feature of the invention, there is provided, in addition to the first wheel set, a second wheel set having at least three second wheels, which should be driven through an optionally present first motor or a second motor optionally to be provided and is constructed in such a way that the instrument holder can be moved on it perpendicular to the direction in which it is movable on the first wheel set. This kind of instrument holder can be employed especially advantageously for inspecting a dynamo-electric machine having an approximately cylindrical internal recess in the yoke. On the first wheel set, the instrument holder can be moved parallel to the axis of the internal recess, while on the second wheel set that can be used alternatively to the first wheel set, it can be moved at a tangent to that axis. In this way, it can reach any point on the internal recess without having to be displaced by using external means or by human workers. The instrument holder that is additionally equipped with the second wheel set thus enables the most extensive possible automation of inspection, which is especially advantageous considering the enormous costs generally associated with such an inspection.

In accordance with an additional feature of the invention, the first wheel set and the second wheel set are alternatively mounted on the internal recess of the yoke with a hoist, which is operated through a separate motor, for instance, and can displace the first wheel set relative to the second wheel set in a hoisting direction that is perpendicular to the first and second axes. It is conceivable for each second wheel to be steered in the hoisting direction displaceably on the frame section of the instrument holder, and for all of the second wheels optionally to be displaced in synchronism relative to the first wheels. In accordance with yet another feature of the invention, there is also provided, or in addition to the frame section, an auxiliary frame displaceable relative to it in the hoisting direction (or a plurality of such auxiliary frames), on which the wheels of the second wheel set should be secured.

In accordance with yet a further feature of the invention, a number of magnets are provided on the instrument holder in such a way that each magnet is associated with one wheel, that is a first wheel or optionally a second wheel. The magnet may be secured to the instrument holder in the vicinity of the corresponding wheel.

In accordance with yet an added feature of the invention, a magnet is combined with the corresponding wheel in such a way that each applicable wheel has a rotationally symmetrical, in particular cylindrical, magnet aligned axially to the axis of the wheel, with an internal bore in the magnet that is axial to the axis and with a hub fitted into this internal bore. The magnet thus forms a component of the wheel.

Naturally, the wheel may have additional components, which is desirable particularly in the case of magnets made of brittle materials. In accordance with yet an additional feature of the invention, a non-ferromagnetic, round disk is pressed against the magnet in the axial direction on at least one side; the disk has a slightly larger diameter with respect to the axis than the magnet so that the wheel does not roll on the magnet, or rolls not only on the magnet but at least primarily rolls on the disk. Moreover, the magnet may be surrounded by a solid, in particular metal sheath, on which the wheel can roll without particularly straining the magnet. A disk mounted on the magnet may also be used to guide the wheel on a yoke provided with slots, of the kind that generally is present in dynamo-electric machines. The wheel can roll on the yoke in such a way that the disk protrudes a small distance into the slot directly at one edge of the slot in the region of its opening. This kind of guidance enables further-improved certainty of positioning the instrument holder, which makes a further contribution to precision and reproducibility of the measurements to be carried out for inspection purposes.

In accordance with again another feature of the invention, each of the second wheels has a suspension, especially having at least one rubber-elastic plate.

In accordance with again a further feature of the invention, the first wheel set has at least four first wheels, or the first wheel set has at least four first wheels and the second wheel set has at least four second wheels.

In accordance with again an added feature of the invention, the inspection instruments include an inspection device, particularly a video camera and/or an ultrasound probe, and auxiliary devices, such as a lamp.

With the objects of the invention in view, there is also provided a method for inspecting a dynamo-electric machine including a stator having a ferromagnetic yoke with an internal recess and a rotor disposed in the internal recess defining a gap between the yoke and the rotor, which comprises introducing an instrument holder, carrying means for inspecting the machine, into the gap; and pressing the instrument holder against the yoke with at least one magnet.

In accordance with another mode of the invention, there is provided a method which comprises rolling the instrument holder on the yoke with first wheels.

With the objects of the invention in view, there is additionally provided a dynamo-electric machine having a stator with a ferromagnetic yoke and a rotor that is disposed in an internal recess of the yoke, leaving a gap, wherein an instrument holder according to the invention is disposed in the gap.

Other features which are considered as characteristic for the invention are set forth in the appended claims.

Although the invention is illustrated and described herein as embodied in an instrument holder and a method for inspection of a dynamo-electric machine in a gap between a stator and a rotor and a dynamo-electric machine having the instrument holder, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
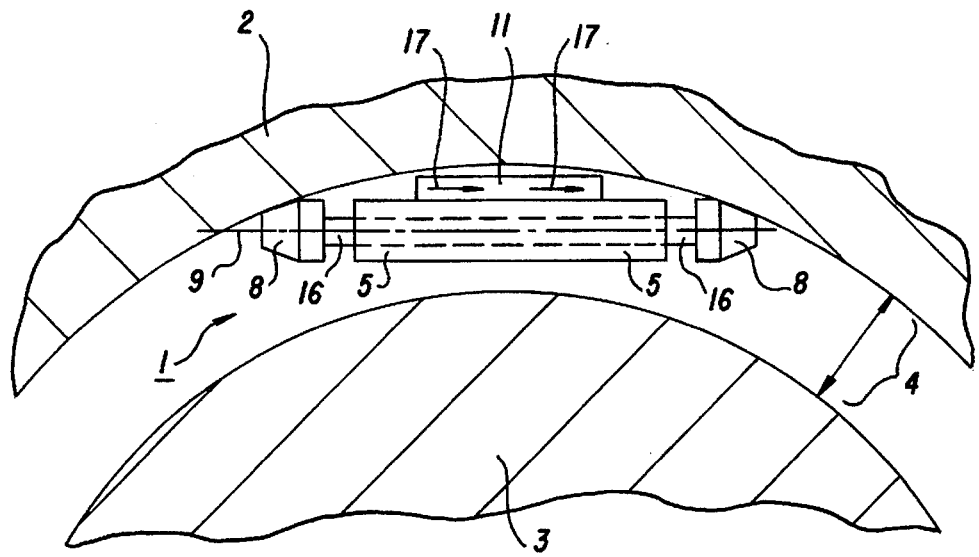
FIG. 1 is a fragmentary, diagrammatic, sectional view of an instrument holder according to the invention in a dynamo-electric machine.

Referring now in detail to the figures of the drawing, in which exemplary embodiments are shown slightly distorted where that serves the purpose of clearly illustrating the invention, and first, particularly, to FIG. 1 thereof, there is seen a way in which an instrument holder 1 according to the invention is used in a dynamo-electric machine in a gap 4 (typically called the "air gap") between a ferromagnetic yoke 2 of a stator of the dynamo-electric machine and a rotor 3 that is rotatable about a non-illustrated axis of rotation. The instrument holder 1 has a frame section 5 and is provided with a magnet 11, which in this case is secured to the frame section 5, and which is preferably a permanent magnet with a magnetization direction 17. In this way, the instrument holder 1 is firmly retained against the yoke 2 by magnetic forces between the magnet 11 and the ferromagnetic yoke 2, regardless of the azimuthal position of the instrument holder. It will be understood that the structural sizes of the instrument holder 1 must take the geometric conditions in the gap 4 into account. However, this is attainable within the competence of one of ordinary skill in the art. A progressive motion of the instrument holder 1 on the yoke 2 takes place on first wheels 8, each of which is rotatable about a first axis 9 and is disposed on the frame section 5. In this specific instance, each first wheel 8 is joined to the frame section 5 by a respective likewise rotatable hub 16, which is supported in a manner that is known per se. In order to improve the contact of each first wheel 8 with the yoke 2, each first wheel is constructed in such a way as to be partially conical in the example shown, so that it does not merely rest on the yoke 2 at one point. This is especially useful in order to avoid scratches and notches on the yoke 2. In FIG. 1, the yoke 2 is shown with an essentially circular internal recess, because this is most advantageous for the sake of explaining the principle underlying the invention. In actual practice, the internal recess of a yoke 2 in a stator has a certain structure, that is described in further detail in conjunction with FIG. 3, which should be taken into account as applicable in constructing the instrument holder 1 of the invention. The construction of the first wheels 8 may be adapted in a manner that is known per se to the particular requirements of any specific case.

Figure 2:
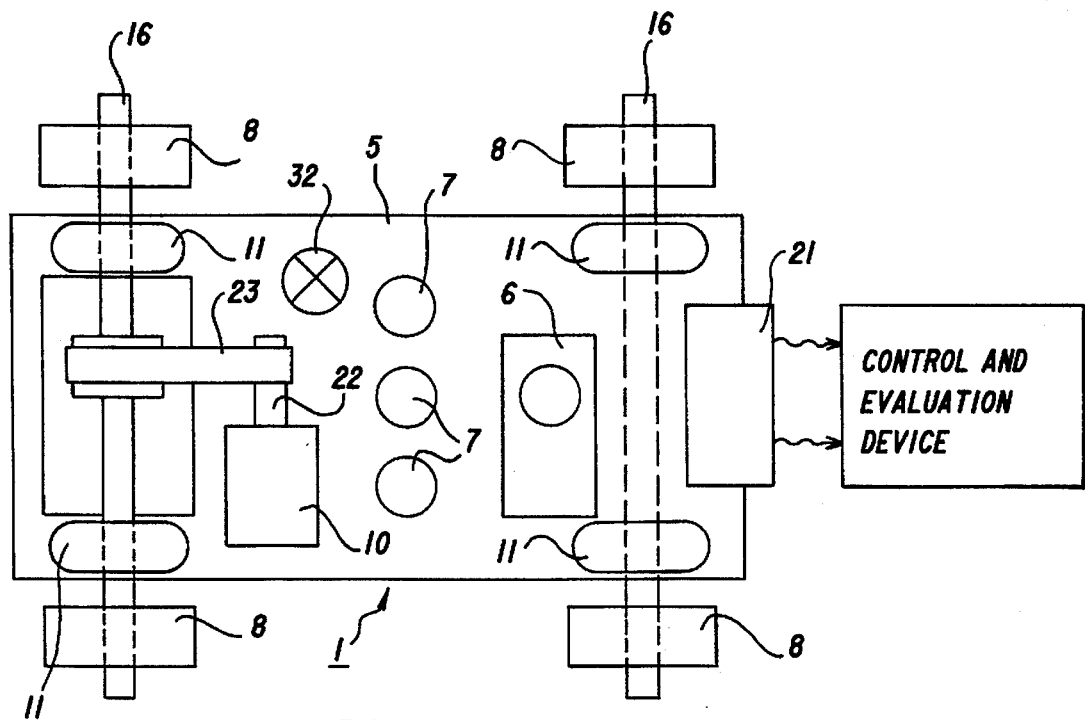
FIG. 2 is a plan view of an instrument holder equipped with instruments.

FIG. 2 shows a plan view of an embodiment of the instrument holder 1 of the invention. The instrument holder 1 has the frame section 5, on which the instruments for carrying out an inspection of a dynamo-electric machine are disposed. The instruments specifically include a video camera 6, three ultrasound probes 7 and a lamp 32. These instruments are listed as being representative of many other kinds of instruments. The instrument holder 1 may in particular also be equipped with test devices for the magnetic properties of the components of dynamo-electric machines and may be equipped with mechanical manipulators, such as grippers. In particular, the instrumentation is not limited to electrically controllable instruments.

Devices that are manipulatable pneumatically and/or hydraulically may naturally also be used. The instrument holder 1 has four first wheels 8 and four magnets 11, with one magnet 11 being assigned to each respective first wheel 8. Each first wheel 8 is seated on a hub 16 supported in the frame section 5. The instrument holder 1 is driven by a first motor 10, in particular an electric motor, from which a drive shaft 22 extends that is connected to a hub 16 through a drive belt 23. It will be understood that instead of force transmission by means of drive belts 23, force transmission can be performed by means of articulated shafts and the like. It should also be noted that the hub 16 need not necessarily be rigid. Depending on requirements, it may also be bendable, at least in some sections, or include cardan joints. This is particularly applicable whenever the axes of the first wheels 8 located on different sides of the frame section 5 must be slightly inclined relative to one another for the sake of better contact with the yoke. Finally, the instrument holder 1 of the invention is provided with a connection device 21, particularly a plug that is known per se and/or a base for such a plug, which is again known per se, or some other electrical, hydraulic or pneumatic connecting element. The connection device is used for connection of the various devices, in particular the instruments 6, 7 and the first motor 10, to control and evaluation devices that are to be stationed outside the dynamo-electric machine. Leads extend from the connection device 21 to the instruments 6, 7 and to the first motor 10. For the same of simplicity, these leads have not been shown.

Figure 3:
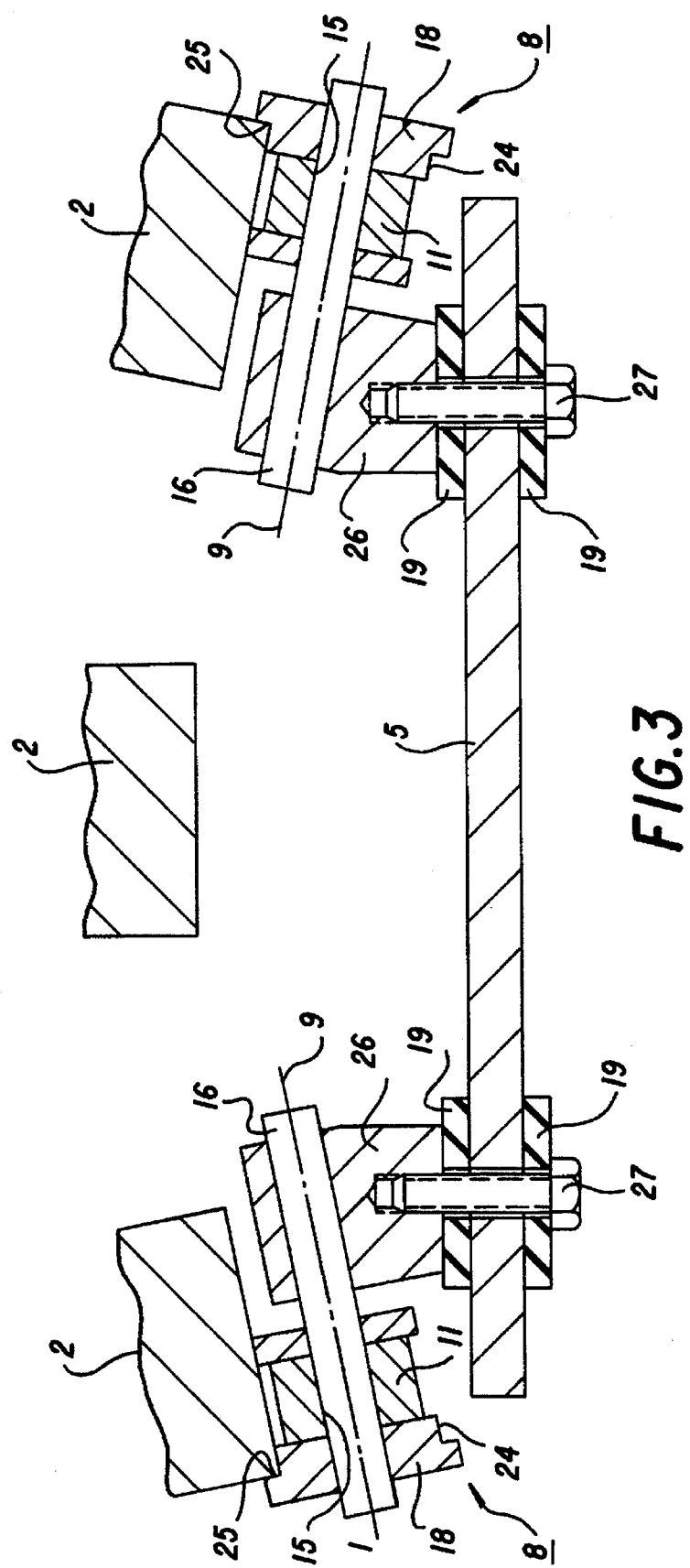
FIG. 3 is a fragmentary, cross-sectional view of a special embodiment of the instrument holder of the invention.

FIG. 3 is a cross section through a special embodiment of an instrument holder 1 according to the invention, which is seated on a yoke 2. The yoke 2 is shown in the form of three "teeth", between which there are open spaces in the form of slots, into which the electric windings of the stator should be placed according to conventional practice. Edges 25 that necessarily exist on the yoke 2 because of the provision of these slots may advantageously be used to guide the first wheels 8, and therefore these first wheels 8 have steps 24 that correspond with the edges 25. In the exemplary embodiment shown, one magnet 11, specifically a cylindrically symmetrical magnet 11 with an internal recess 15, is integrated with each first wheel 8. A hub 16, on which the first wheel 8 is supported, is passed through the internal recess 15 of the magnet 11. Since many permanent magnetic materials, which are to be considered for the magnet 11, are relatively brittle, each first wheel 8 has disks 18 resting on two end surfaces of the magnet 11 that are axial with respect to the first axis 9. With respect to this axis 9, the disks 18 each have a slightly larger diameter than the magnet 11, so that each first wheel 8 rests on this disk 18 rather than resting on the magnet 11 on the yoke 2. Protection of the magnet 11 from mechanical strain may optionally be further improved by surrounding it with a non-illustrated sheath of non-magnetic metal or plastic. One disk 18 on each first wheel 8 has the step 24 serving to guide it on the yoke 2. Each first wheel 8 is supported in a manner that is known per se in a bearing block 26. Each bearing block 26 is secured to the frame section 5 by means of a screw 27. In order to suspend the first wheel 8, one rubber plate 16 or the like is provided between the frame section 5 and each bearing block 26 or between the frame section 5 and each screw 27.

Figure 4:
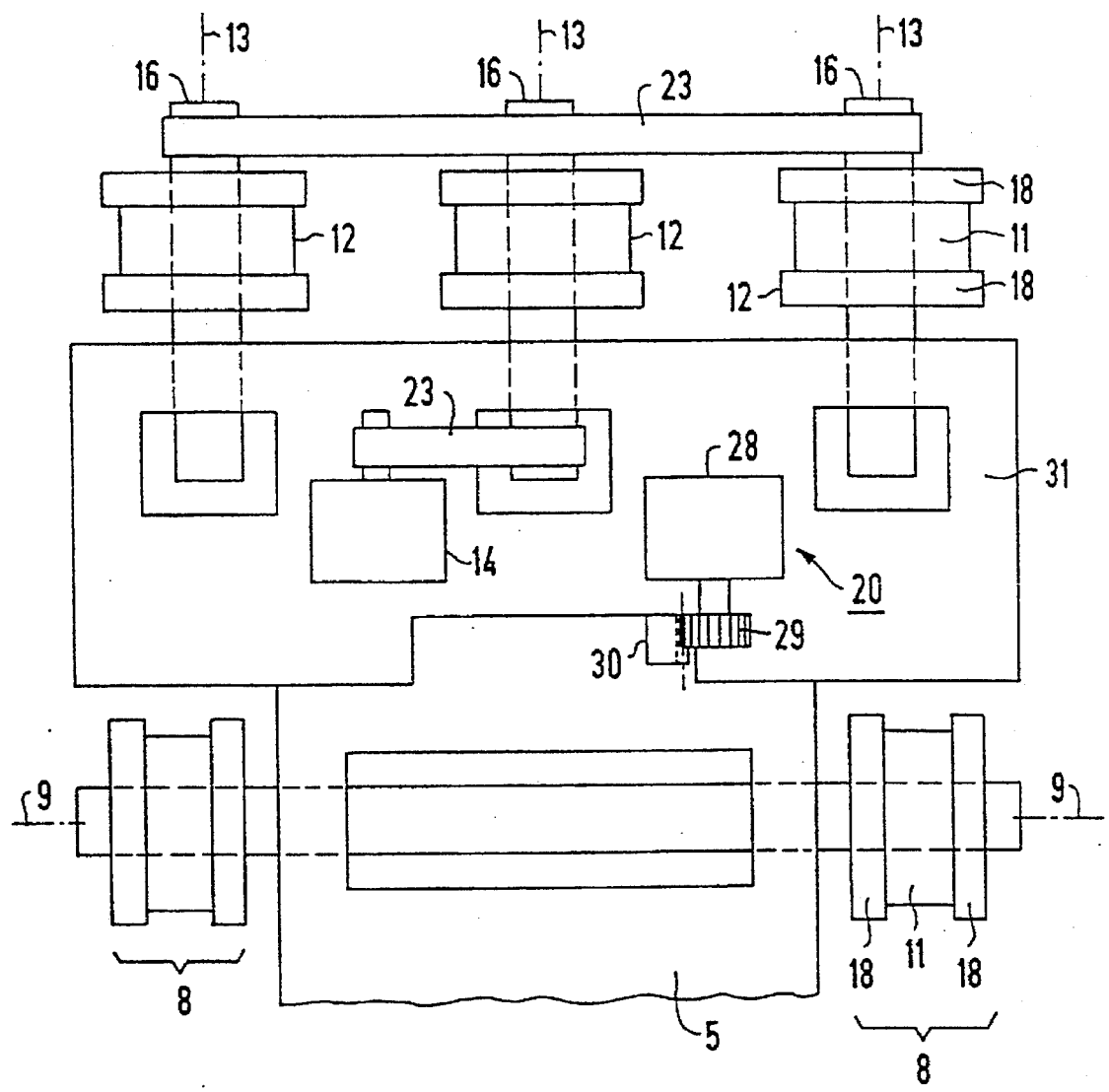
FIG. 4 is a fragmentary, plan view of a portion of a further-developed instrument holder.

FIG. 4 shows a portion of a plan view of an instrument holder according to the invention, which is provided not only with the aforementioned first wheels 8 but also with second wheels 12 and as a result is movable in two directions that are at right angles to one another, without requiring steering devices, although in the context of the invention they would naturally also be usable. The first wheels 8 and the second wheels 12, as was already discussed in detail in conjunction with FIG. 3, are made up of rotationally symmetrical magnets 11, disks 18 mounted thereon, and hubs 16. Each second wheel 12 is rotatable about a second axis 13, which is essentially disposed at right angles to each first axis 9. A drive of the second wheels 12 is effected by a second motor 14, which is connected to all of the second wheels 12 through drive belts 23. This is especially useful if the instrument holder is used in a toothed yoke, similar to that shown in FIG. 3, and is to be moved across the yoke in the azimuthal direction. In such a case it may happen that not all of the second wheels 12 are in contact with the yoke 2, which could cause problems if all of the second wheels 12 are not driven in the same way. The second wheels 12 are not located directly on the frame section 5 but rather on an auxiliary frame 31, which is displaceable in a hoisting direction at right angles to the second axes 13 and the first axes 9 by means of a hoist 20. The hoist 20 enables operation of the second wheel set having the second wheels 12, alternatively to the operation of the first wheel set having the first wheels 8. The hoist 20 is shown by way of example with a hoisting motor 28 on the auxiliary frame 31, which is in engagement with a rack 30 on the frame section 5 through a pinion 29. This illustration is intended solely as an example of the entire range of electrical, pneumatic and hydraulic hoists that are known per se and can be used in this case. The instrument holder of FIG. 4 has a total of two auxiliary frames 31, one on each end.

The invention enables particularly simple and reliable inspection of the stator and/or the rotor of a dynamo-electric machine from the gap between the stator and rotor, without requiring removal of the rotor for inspection. The instrument holder according to the invention does not require any mechanically rigid connecting and guiding elements such as rails, and is therefore unproblematic and economical in use, in comparison with previously conventional inspection equipment.

We claim:

1. In a dynamo-electric machine including a stator having a ferromagnetic yoke with an internal recess and a rotor disposed in the internal recess defining a gap between the yoke and the rotor, an instrument holder to be introduced into the gap for inspecting the dynamo-electric machine, comprising:

a) a frame section, instruments secured to said frame section for inspecting the dynamo-electric machine;

b) at least one wheel set having at least three wheels for moving the instrument holder in the gap, approximately mutually parallel axes, each of said wheels being rotatable about a respective one of said axes;

c) a connection device to be connected to leads for connecting the instrument holder to a control and evaluation device; and d) at least one magnet for pressing said wheels of the instrument holder against the yoke in the gap, wherein each of said wheels has a suspension.

2. The instrument holder according to claim 1, wherein said suspensions each have at least one rubber-elastic plate.

3. The instrument holder according to claim 1, including at least one motor for driving said at least one wheel set.

4. The instrument holder according to claim 1, wherein said at least one magnet is a permanent magnet.

5. The instrument holder according to claim 1, wherein said wheel set has at least four wheels.

6. The instrument holder according to claim 1, wherein said inspection instruments include at least one inspection device selected from the group consisting of a video camera, an ultrasound probe, and an auxiliary device.

7. The instrument holder according to claim 6, wherein said auxiliary device is a lamp.

8. A dynamo-electric machine, comprising:

a) a stator having a ferromagnetic yoke with an internal recess and a rotor disposed in said internal recess defining a gap between said yoke and said rotor; and b) an instrument holder to be introduced into said gap for inspecting the dynamo-electric machine, said instrument holder including:

b1) a frame section and instruments secured to said frame section for inspecting the dynamo-electric machine;

b2) at least one wheel set having at least three wheels for moving said instrument holder in said gap, approximately mutually parallel axes, each of said wheels being rotatable about a respective one of said axes, and each of said wheels having a suspension;

b3) a connection device to be connected to leads for connecting the instrument holder to a control and evaluation device; and b4) at least one magnet for pressing said wheels of the instrument holder against said yoke in said gap.

9. A method for inspecting a dynamo-electric machine including a stator having a ferromagnetic yoke with an internal recess and a rotor disposed in the internal recess defining a gap between the yoke and the rotor, which comprises:

introducing an instrument holder, carrying means for inspecting the machine, into the gap;

rolling the instrument holder on the yoke with wheels each supported on the instrument holder by respective suspensions; and pressing the instrument holder against the yoke with at least one magnet.

\* \* \* \* \*